(12) United States Patent
Wu et al.

(10) Patent No.: US 11,222,908 B2
(45) Date of Patent: Jan. 11, 2022

(54) ARRAY SUBSTRATE AND PREPARATION METHOD THEREOF, TOUCH DISPLAY PANEL

(71) Applicants: ORDOS YUANSHENG OPTOELECTRONICS CO., LTD., Ordos (CN); BOE TECHNOLOGY GROUP CO., LTD., Beijing (CN)

(72) Inventors: Xinguo Wu, Beijing (CN); Fengguo Wang, Beijing (CN); Dawei Shi, Beijing (CN); Hong Liu, Beijing (CN); Zifeng Wang, Beijing (CN); Feng Li, Beijing (CN); Bo Ma, Beijing (CN); Zhixuan Guo, Beijing (CN); Yuanbo Li, Beijing (CN); Jing Zhao, Beijing (CN); Cenhong Duan, Beijing (CN); Haiqin Liang, Beijing (CN)

(73) Assignees: ORDOS YUANSHENG OPTOELECTRONICS CO., LTD., Inner Mongolia (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/631,524

(22) PCT Filed: Aug. 6, 2018

(86) PCT No.: PCT/CN2018/098998
§ 371 (c)(1),
(2) Date: Jan. 16, 2020

(87) PCT Pub. No.: WO2019/114287
PCT Pub. Date: Jun. 20, 2019

(65) Prior Publication Data
US 2020/0185416 A1 Jun. 11, 2020

(30) Foreign Application Priority Data
Dec. 15, 2017 (CN) .......................... 201711352621.6

(51) Int. Cl.
*H01L 27/12* (2006.01)
*G06F 3/041* (2006.01)
*G06F 3/047* (2006.01)

(52) U.S. Cl.
CPC ............ *H01L 27/124* (2013.01); *G06F 3/047* (2013.01); *G06F 3/0412* (2013.01); *H01L 27/1259* (2013.01); *G06F 2203/04103* (2013.01)

(58) Field of Classification Search
CPC . H01L 27/124; H01L 27/1259; G06F 3/0412; G06F 3/047; G06F 2203/04103
(Continued)

(56) References Cited
U.S. PATENT DOCUMENTS
9,098,134 B2   8/2015   Lee et al.
9,543,443 B2   1/2017   Sun et al.
(Continued)

FOREIGN PATENT DOCUMENTS
CN   102272935        12/2011
CN   103364983 A      10/2013
(Continued)

OTHER PUBLICATIONS

International Search Report and Written Opinion in Corresponding Chinese Patent Application No. PCT/CN2018/098998 dated Nov. 12, 2018. 11 pages.
(Continued)

*Primary Examiner* — Amare Mengistu
*Assistant Examiner* — Gloryvid Figueroa-Gibson
(74) *Attorney, Agent, or Firm* — Leason Ellis LLP

(57) ABSTRACT

An array substrate is provided. The array substrate includes a base, a first electrode and a second electrode which are on
(Continued)

the base and a touch line on the base, both the first electrode and the second electrode are configured to transmit a display signal, the touch line is configured to transmit a touch signal; the first electrode and the touch line are respectively in different layers, and an orthographic projection of the first electrode on the base at least partially overlaps with an orthographic projection of the touch line on the base. A preparation method of the array substrate and a touch display panel are further provided.

20 Claims, 12 Drawing Sheets

(58) Field of Classification Search
 USPC .......................................................... 345/156
 See application file for complete search history.

(56) References Cited

U.S. PATENT DOCUMENTS

| | | | |
|---|---|---|---|
| 9,568,760 | B2 | 2/2017 | Woo et al. |
| 9,886,125 | B2 | 2/2018 | Zhang et al. |
| 10,274,793 | B2 | 4/2019 | Du |
| 10,338,715 | B2 | 7/2019 | Hong |
| 10,386,667 | B2 | 8/2019 | Ahn et al. |
| 10,496,202 | B2* | 12/2019 | Zhan ..................... G06F 3/0446 |
| 2003/0117059 | A1 | 6/2003 | Koo et al. |
| 2014/0145310 | A1 | 5/2014 | Akiyama |
| 2015/0185903 | A1 | 7/2015 | Park |
| 2016/0187694 | A1 | 6/2016 | Kim et al. |
| 2016/0246399 | A1 | 8/2016 | Huang et al. |
| 2016/0299612 | A1 | 10/2016 | Lu et al. |
| 2017/0038887 | A1* | 2/2017 | Zhang ................. G06F 3/04166 |
| 2017/0059908 | A1* | 3/2017 | Yen ................... G02F 1/136286 |
| 2017/0092658 | A1 | 3/2017 | Sun et al. |
| 2017/0110685 | A1 | 4/2017 | Lee et al. |
| 2017/0177143 | A1 | 6/2017 | Ding et al. |
| 2017/0177159 | A1 | 6/2017 | Cao et al. |
| 2018/0260058 | A1* | 9/2018 | Zhan ....................... G06F 3/047 |

FOREIGN PATENT DOCUMENTS

| | | | | |
|---|---|---|---|---|
| CN | 103383946 | | 11/2013 | |
| CN | 104332477 | | 2/2015 | |
| CN | 104407757 | | 3/2015 | |
| CN | 104657024 | | 5/2015 | |
| CN | 104657024 | A | 5/2015 | |
| CN | 104777933 | | 7/2015 | |
| CN | 104915062 | | 9/2015 | |
| CN | 104991690 | | 10/2015 | |
| CN | 105487719 | | 4/2016 | |
| CN | 105572935 | | 5/2016 | |
| CN | 105739203 | A | 7/2016 | |
| CN | 106168865 | | 11/2016 | |
| CN | 106168865 | A * | 11/2016 | ............. G06F 3/047 |
| CN | 106168865 | A | 11/2016 | |
| CN | 106226961 | A | 12/2016 | |
| CN | 106908975 | A | 6/2017 | |
| CN | 106909249 | A | 6/2017 | |
| CN | 107340929 | A | 11/2017 | |
| CN | 108110010 | A | 6/2018 | |
| CN | 108121476 | A | 6/2018 | |
| KR | 20130015126 | A | 2/2013 | |

OTHER PUBLICATIONS

Chinese Office Action in corresponding Chinese Application No. 201711352621.6, dated Dec. 14, 2019 (an English translation attached hereto). 21 pages.
Chinese Patent Office Action dated Jun. 29, 2018 corresponding to Chinese Patent Application No. 201610493669.8 19 pages.
International Search Report dated Aug. 2, 2017 corresponding to International Patent Application No. PCT/CN2017/088443; 22 pages.
Office Action in U.S. Appl. No. 15/571,724 dated Dec. 10, 2018 ,15 pages.
Office Action in U.S. Appl. No. 15/571,724 dated Apr. 22, 2019 ,11 pages.

* cited by examiner

ARRAY SUBSTRATE AND PREPARATION METHOD THEREOF, TOUCH DISPLAY PANEL

CROSS-REFERENCE TO RELATED PATENT APPLICATIONS

This application is a U.S. National Stage Application under 35 U.S.C. § 371 of International Patent Application No. PCT/CN2018/098998, filed Aug. 6, 2018, which claims priority to the Chinese patent application No. 201711352621.6, filed on Dec. 15, 2017, both of which are incorporated by reference in their entireties. The International Application was published on Jun. 20, 2019, as International Publication No. WO 2019/114287 A1.

TECHNICAL FIELD

Embodiments of the present disclosure relate to an array substrate and a preparation method thereof, and a touch display panel.

BACKGROUND

With the rapid development of display technology, touch panels have gradually spread throughout people's lives. The touch panels can be divided into types such as Add on mode, On-Cell mode and In-Cell mode according to composition structures thereof. Among them, an In-Cell touch panel embeds a touch electrode of a touch module inside a display module, and combines display and touch to a single module, thus greatly reducing an overall thickness of the display module, making the product lighter, and greatly reducing manufacturing cost. At present, self-capacitance touch panels have gradually become mainstream touch panels among In-Cell touch panels.

A self-capacitance touch panel directly adds touch electrodes and touch lines on a Thin Film Transistor (TFT) array substrate, and adopts a time-sharing driving mode, in which effective time of one frame is divided into display time and touch time, and driving signals of the two periods are processed separately. In the display time, the touch electrode is multiplexed as a common electrode, the touch line is multiplexed as a common electrode line, the touch line provides a common voltage signal to the touch electrode without performing touch signal scanning, and in the touch time, the touch signal scanning is performed through the touch line, and the display and the touch work independently in a time-sharing manner.

Although the self-capacitance touch panel has advantages of simple structure and easy realization, it also has a defect of low aperture ratio. In recent years, high-brightness display has gradually become a main development trend of touch panels, while the low aperture ratio of the self-capacitance touch panel seriously restricts brightness enhancement of the touch panel.

SUMMARY

At least one embodiment of the present disclosure provides an array substrate comprising a base, a first electrode and a second electrode which are on the base and are configured to transmit a display signal, and a touch line configured to transmit a touch signal; the first electrode and the touch line are respectively in different layers, and an orthographic projection of the first electrode on the base at least partially overlaps with an orthographic projection of the touch line on the base.

In an embodiment of the present disclosure, the orthographic projection of the touch line on the base is within the orthographic projection of the first electrode on the base, or the orthographic projection of the first electrode on the base is within the orthographic projection of the touch line on the base.

In an embodiment of the present disclosure, the second electrode and the touch line are in a same layer.

In an embodiment of the present disclosure, the touch line is further configured to transmit a common voltage signal.

In an embodiment of the present disclosure, the array substrate further comprises a buffer layer, an active layer, a gate insulation layer, a gate electrode and an interlayer insulation layer, the buffer layer covers the first electrode, the active layer is on the buffer layer and is connected with the first electrode through a via hole in the buffer layer, the gate insulation layer covers the active layer, the gate electrode is on the gate insulation layer, the interlayer insulation layer covers the gate electrode, the second electrode and the touch line are on the interlayer insulation layer, and the second electrode is connected with the active layer through a via hole in the interlayer insulation layer.

In an embodiment of the present disclosure, the array substrate further comprises a light shielding layer, the light shielding layer and the first electrode are in a same layer.

In an embodiment of the present disclosure, the array substrate further comprises a flat layer, a touch electrode, a passivation layer and a pixel electrode; the flat layer covers the second electrode and the touch line, the touch electrode is on the flat layer and is connected with the touch line through a via hole in the flat layer, the passivation layer covers the touch electrode, and the pixel electrode is on the passivation layer and is connected with the second electrode through a via hole passing through the passivation layer and the flat layer, or, the passivation layer covers the second electrode and the touch line, the pixel electrode is on the passivation layer and is connected with the second electrode through a via hole in the passivation layer, the flat layer covers the pixel electrode, and the touch electrode is on the flat layer and is connected with the touch line through a via hole passing through the flat layer and the passivation layer.

At least one embodiment of the present disclosure further provides a touch display panel comprising the above-mentioned array substrate.

At least one embodiment of the present disclosure further provides a preparation method of an array substrate, comprising: forming a first electrode and a second electrode which are configured to transmit a display signal, and a touch line which is configured to transmit a touch signal on a base, in which the first electrode and the touch line are respectively formed in different layers, and an orthographic projection of the first electrode on the base at least partially overlaps with an orthographic projection of the touch line on the base.

In an embodiment of the present disclosure, the orthographic projection of the touch line on the base is within the orthographic projection of the first electrode on the base, or the orthographic projection of the first electrode on the base is within the orthographic projection of the touch line on the base.

In an embodiment of the present disclosure, the second electrode and the touch line are in a same layer.

In an embodiment of the present disclosure, the touch line is further configured to transmit a common voltage signal.

In an embodiment of the present disclosure, forming the first electrode and the second electrode which are configured to transmit a display signal, and the touch line which is configured to transmit a touch signal on the base comprises: forming the first electrode on the base; forming a buffer layer that covers the first electrode and has a first via hole; forming an active layer on the buffer layer, wherein the active layer is connected with the first electrode through the first via hole; forming a gate insulation layer that covers the active layer, and forming a gate electrode on the gate insulation layer, forming an interlayer insulation layer that covers the gate electrode and has a second via hole; and forming the second electrode and the touch line on the interlayer insulation layer, wherein the second electrode is connected with the active layer through the second via hole.

In an embodiment of the present disclosure, a light shielding layer is formed when the first electrode is formed on the base.

In an embodiment of the present disclosure, forming the active layer on the buffer layer comprises: forming a low temperature polysilicon active layer on the buffer layer.

In an embodiment of the present disclosure, the preparation method further comprises: forming a flat layer that covers the second electrode and the touch line and has a third via hole, forming a touch electrode on the flat layer, wherein the touch electrode is connected with the touch line through the third via hole, forming a passivation layer that covers the touch electrode and forming a fourth via hole passing through the passivation layer and the flat layer, and forming a pixel electrode on the passivation layer, wherein the pixel electrode is connected with the second electrode through the fourth via hole; or, forming a passivation layer that covers the second electrode and the touch line and has a fourth via hole, forming a pixel electrode on the passivation layer, wherein the pixel electrode is connected with the second electrode through the fourth via hole, forming a flat layer that covers the pixel electrode, and forming a third via hole passing through the flat layer and the passivation layer, and forming a touch electrode on the flat layer, wherein the touch electrode is connected with the touch line through the third via hole.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

NUMERAL REFERENCES

10—base; 11—light shielding layer, 12—buffer layer; 13—LTPS active layer, 14—gate insulation layer; 15—gate electrode; 16—interlayer insulation layer, 17—first electrode; 18—second electrode; 19—touch line; 20—flat layer; 21—touch electrode; 22—passivation layer, 23—pixel electrode.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment (s), without any inventive work, which should be within the scope of the disclosure.

In the description of embodiments of the present disclosure, it should be understood that the orientation or positional relationship indicated by the terms "middle", "upper", "lower", "front", "rear", "vertical", "horizontal", "top", "bottom", "inner", "outer" and the like are based on the orientation or positional relationship illustrated in the figures, only for convenience of describing the present disclosure and simplifying the description, but these terms do not indicate or imply that the indicated device or element must have a specific orientation, be constructed and operated in a specific orientation, and therefore cannot be understood as a limitation of the present disclosure.

In the description of embodiments of the present disclosure, it should be noted that the terms "installed", "connected" and "bonded" should be understood broadly unless otherwise specified and defined, for example, they may refer to fixed connection, detachable connection or integrated connection, or refer to mechanical connection or electrical connection, they may also refer to be direct connection, or indirectly connection through an intermediate medium, or they may refer to internal communication of two components. For those of ordinary skill in the art, the specific meaning of the above terms in the present disclosure can be understood in specific situations.

Figure 1:
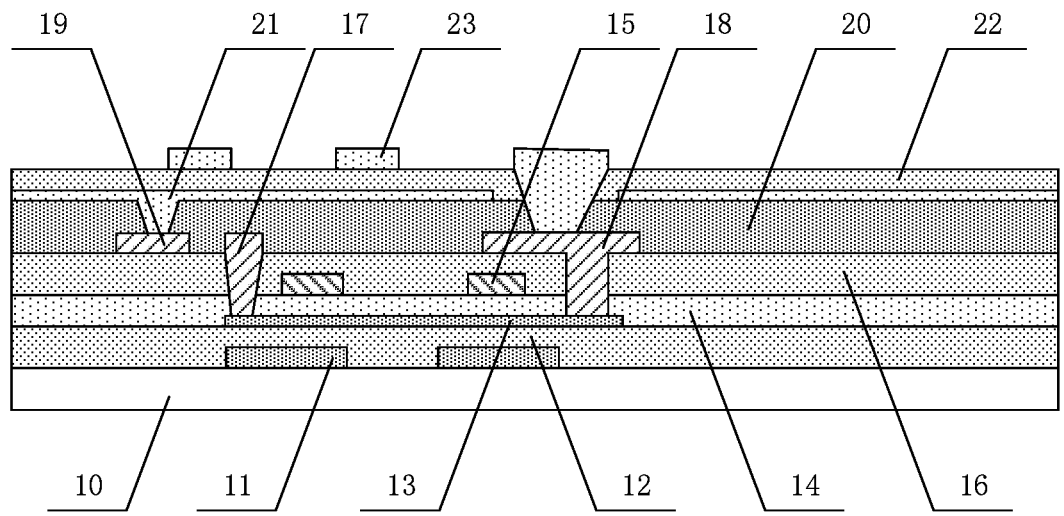
FIG. 1 is a structural schematic diagram of a self-capacitance touch array substrate known by the inventor.

FIG. 1 is a structural schematic diagram of a self-capacitance touch array substrate known by the inventor, and the array substrate is a structure including a low temperature poly-silicon (LTPS) thin film transistor. As illustrated in FIG. 1, the array substrate comprises a base 10, a light shielding layer 11 arranged on the base, a buffer layer 12 that covers the light shielding layer 11, an LTPS active layer 13 arranged on the buffer layer 12, a gate insulation layer 14 that covers the LTPS active layer 13, a gate electrode 15 arranged on the gate insulation layer 14, an interlayer insulation layer 16 that covers the gate electrode 15, a first electrode 17 and a second electrode 18 that are arranged on the interlayer insulation layer 16, a touch line 19 arranged on the interlayer insulation layer 16, in which the first electrode 17 and the second electrode 18 are respectively a source electrode and a drain electrode, and the first electrode 17 and the second electrode 18 are respectively connected with the LTPS active layer 13 through via holes respectively located in the gate insulation layer 14 and the interlayer insulation layer 16, a flat layer 20 that covers the first electrode 17, the second electrode 18 and the touch line 19, a touch electrode 21 arranged on the flat layer 20, in which the touch electrode 21 is connected with the touch line 19 through a via hole located in the flat layer 20, a passivation layer 22 that covers the touch electrode 21, and a pixel electrode 23 disposed on the passivation layer 22. The pixel electrode 23 is connected to the second electrode 18 through a via hole located in the passivation layer 22 and the flat layer 20. The touch pattern metal (TPM), that is, the touch line, is connected with the touch electrode through the via hole located in the flat layer to realize time-sharing driving of a common voltage and touch scanning.

The inventor of the present disclosure found that a reason for a low aperture ratio of the structure illustrated in FIG. 1 is that the structure adopts a parallel dual source structure, in which the source electrode, drain electrode and touch line are arranged in a same layer and in parallel. Because the touch line is arranged in parallel with the source electrode and the drain electrode in a display region, an opaque wiring region is larger and a light transmission region is reduced, thereby leading to a lower aperture ratio, which is only about 50%, seriously restricting brightness enhancement.

Embodiments of the present disclosure provide an array substrate and a preparation method thereof, and a touch display panel, so as to overcome the defect of low aperture ratio of the existing structure. In the present disclosure, a touch line and a source electrode are arranged in different layers and overlap with each other, that is, an orthographic projection of the touch line on the base and an orthographic projection of the source electrode on the base have overlapping portions, so as to reduce shielding of light by the touch line and increase the light transmission region.

Figure 2:
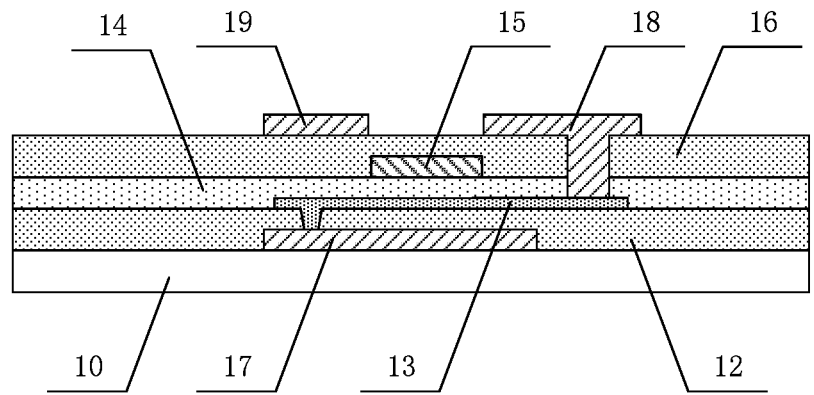
FIG. 2 is a structural schematic diagram of an array substrate according to an embodiment of the present disclosure.

FIG. 2 is a structural schematic diagram of an array substrate according to an embodiment of the present disclosure. The array substrate according to at least one embodiment of the present disclosure includes a first electrode and a second electrode which are configured to transmit a display signal, and a touch line configured to transmit a touch signal; the first electrode and the touch line are respectively disposed in different layers, and an orthographic projection of the first electrode on the base at least partially overlaps with an orthographic projection of the touch line on the base. As illustrated in FIG. 2, a first electrode 17 serving as a source electrode is disposed on the base 10 and is in contact with the base, while a touch line 19 is disposed in another layer on the first electrode 17, the touch line 19 and the first electrode 17 are respectively disposed in different layers, and an orthographic projection of the touch line 19 on the base 10 at least partially overlaps with an orthographic projection of the first electrode 17 on the base 10.

In one embodiment, a second electrode 18 serving as a drain electrode is disposed in a same layer as the touch line 19. The second electrode 18 and the touch line 19 may be formed by same one patterning process. The array substrate further includes a buffer layer 12, an active layer 13, a gate insulation layer 14, a gate electrode 15 and an interlayer insulation layer 16. A layer where the active layer 13 is located is between a layer where the first electrode 17 is located and a layer where the second electrode 18 is located, and the active layer 13 is respectively connected with the first electrode 17 and the second electrode 18.

In one embodiment, an orthographic projection of the touch line 19 on the base is within an orthographic projection of the first electrode 17 on the base, that is, a width of the orthographic projection of the first electrode 17 on the base is larger than a width of the orthographic projection of the touch line 19 on the base 10, and the orthographic projection of the touch line 19 on the base 10 is within the orthographic projection of the first electrode 17 on the base 10. In another embodiment, the orthographic projection of the first electrode 17 on the base 10 is within the orthographic projection of the touch line 19 on the base 10, that is, the width of the orthographic projection of the touch line 19 on the base 10 is larger than the width of the orthographic projection of the first electrode 17 on the base 10, and the orthographic projection of the first electrode 17 on the base 10 is within the orthographic projection of the touch line 19 on the base 10.

At least one embodiment of the present disclosure provides an array substrate. In the array substrate, the first electrode and the touch line are arranged in different layers, the orthographic projection of the first electrode on the base at least partially overlaps with the orthographic projection of the touch line on the base, so that the opaque wiring region is reduced, the light transmission region is increased, the aperture ratio is maximized, and the brightness is further improved.

In the following, technical solutions of the present disclosure are described in detail by specific embodiments.

A technical solution of the present disclosure is illustrated by taking a LTPS thin film transistor array substrate with a double gate structure as an example in the following. FIG. 3 to FIG. 22 are structural diagrams of preparation of an array substrate according to one embodiment of the present disclosure. The mentioned "patterning process" in this embodiment includes processes such as deposition of a film layer, coating a photoresist, mask exposure, development, etching, peeling the photoresist, and so on. It is a mature preparation process. Deposition may adopt mature processes such as sputtering, evaporation, chemical vapor deposition, etc., coating may adopt mature coating processes, etching may adopt mature methods, and no specific limitation is imposed to these here.

Figure 3:
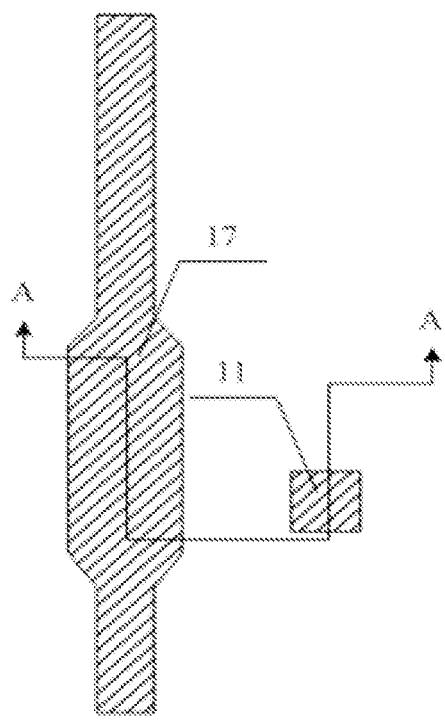
FIG. 3 is a structural schematic diagram of an array substrate after forming patterns of a first electrode and a light shielding layer according to an embodiment of the present disclosure.
Figure 4:
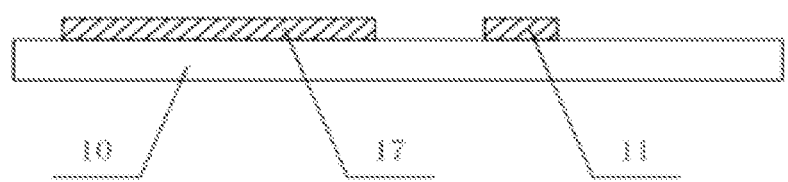
FIG. 4 is a cross-sectional view along a line A-A illustrated in FIG. 3.

(1) A pattern of a first electrode and a pattern of a light shielding layer are formed on a base. Forming the pattern of the first electrode and the pattern of the light shielding layer includes: depositing a first metal film on the base 10; coating a layer of photoresist on the first metal film; exposing and developing the photoresist using a single tone mask to form an unexposed region at positions of the pattern of the first electrode and the pattern of the light shielding layer where the photoresist is retained, and to form a fully exposed region at other positions where the photoresist is removed; etching the first metal film in the fully exposed region and peeling the remaining photoresist, so as to form a pattern of a light shielding layer 11 and a pattern of a first electrode 17, as illustrated in FIG. 3 and FIG. 4, in which the first electrode 17 is a source electrode. By the above process, the pattern of the light shielding layer and the pattern of the first electrode are formed by same one patterning process, and the light shielding layer and the first electrode are made of a same metal material. The base may be a glass substrate or a quartz substrate, and the first metal film may include one or more selected from a group consisting of platinum Pt, ruthenium Ru, gold Au, silver Ag, molybdenum Mo, chromium Cr, aluminum Al, tantalum Ta, titanium Ti, tungsten W and other metals, or may adopt a composite layer structure such as Ti/Al/Ti or Mo/Al/Mo.

Figure 5:
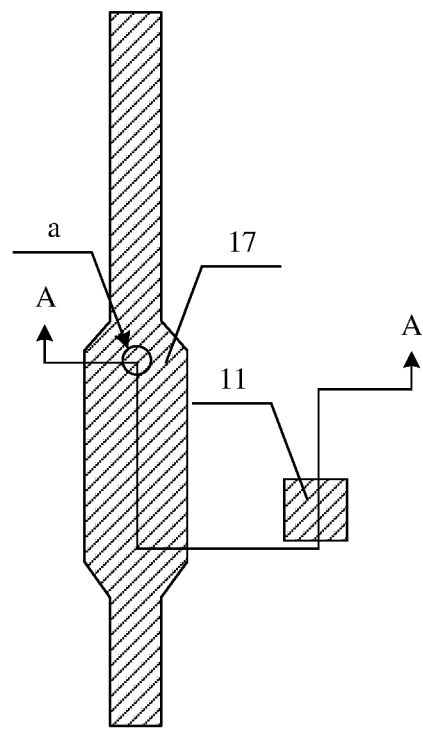
FIG. 5 is a structural schematic diagram of an array substrate after forming a pattern of a buffer layer having a first via hole according to an embodiment of the present disclosure.
Figure 6:
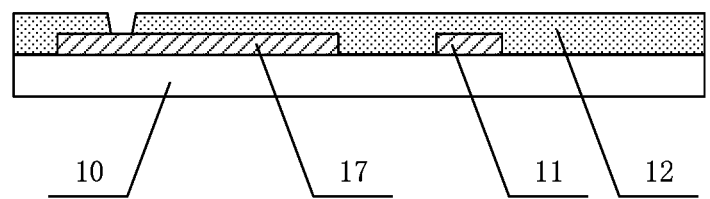
FIG. 6 is a cross-sectional view along a line A-A illustrated in FIG. 5.

(2) A buffer pattern layer with a first via hole is formed on the base formed with the pattern of the light shielding layer and the pattern of the first electrode. Forming the buffer pattern layer with the first via hole includes: depositing a buffer film on the base formed with the pattern of the light shielding layer 11 and the pattern of the first electrode 17, coating a layer of photoresist on the buffer film, exposing and developing the photoresist using a single tone mask to form a fully exposed region at a position of the first via hole where the photoresist is removed, and to form an unexposed region at other positions where the photoresist is retained; etching the buffer film in the fully exposed region and peeling the remaining photoresist, so as to form a pattern of a buffer layer 12 with a first via hole a. The first via hole a is located at the position of the first electrode 17, and a portion, which is in the first via hole, of the buffer film is removed to expose a surface of the first electrode 17, as illustrated in FIG. 5 and FIG. 6. The buffer layer may include silicon nitride SiNx, silicon oxide SiOx or silicon oxynitride Si(ON)x, and may be in a single-layer, double-layer or multi-layer structure. The buffer layer can prevent metal ions in the base from diffusing to the active layer, prevent influence on characteristics such as threshold voltage and leakage current, etc., and an appropriate buffer layer can improve the quality of an interface on a back surface of the polysilicon layer (i.e., the surface of the polysilicon layer facing the base), prevent leakage current at the interface on the back surface of the polysilicon layer, further reduce heat conduction, and slow down a cooling rate of silicon heated by laser.

Figure 7:
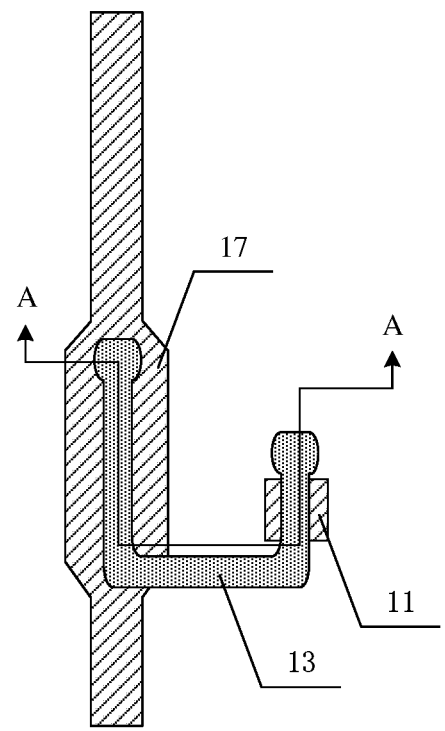
FIG. 7 is a structural schematic diagram of an array substrate after forming a pattern of a LTPS active layer according to an embodiment of the present disclosure.
Figure 8:
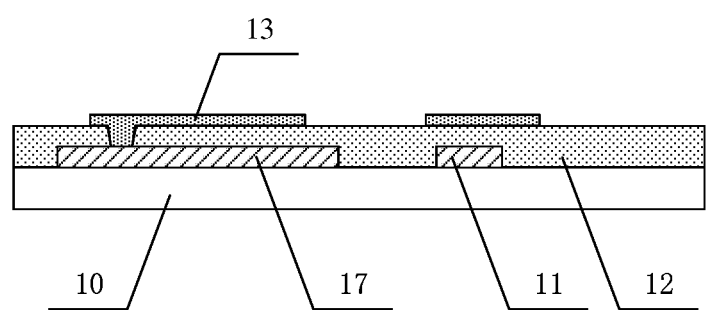
FIG. 8 is a cross-sectional view along a line A-A illustrated in FIG. 7.

(3) A pattern of a LTPS active layer is formed on the base formed with the above patterns. Forming the pattern of the LTPS active layer includes: depositing an amorphous silicon film on the based formed with the above patterns, treating the amorphous silicon film with laser to crystallize the amorphous silicon film into a polycrystalline silicon film, then coating a layer of photoresist on the polycrystalline silicon film, exposing and developing the photoresist with a single tone mask to form an unexposed region at a position of the pattern of the LTPS active layer where the photoresist is retained, and to form a fully exposed region at other positions where the photoresist is removed, and etching the polycrystalline silicon film in the fully exposed region and peeling the remaining photoresist, so as to form the pattern of the LTPS active layer 13, as illustrated in FIG. 7 and FIG. 8. In this embodiment, the LTPS active layer 13 is in a shape of U, a first end of the LTPS active layer 13 is disposed on the first electrode 17 and is connected to the first electrode 17 through the first via hole a in the buffer layer, and a second end of the LTPS active layer 13 is disposed on and crosses over the light shielding layer 11.

Figure 9:
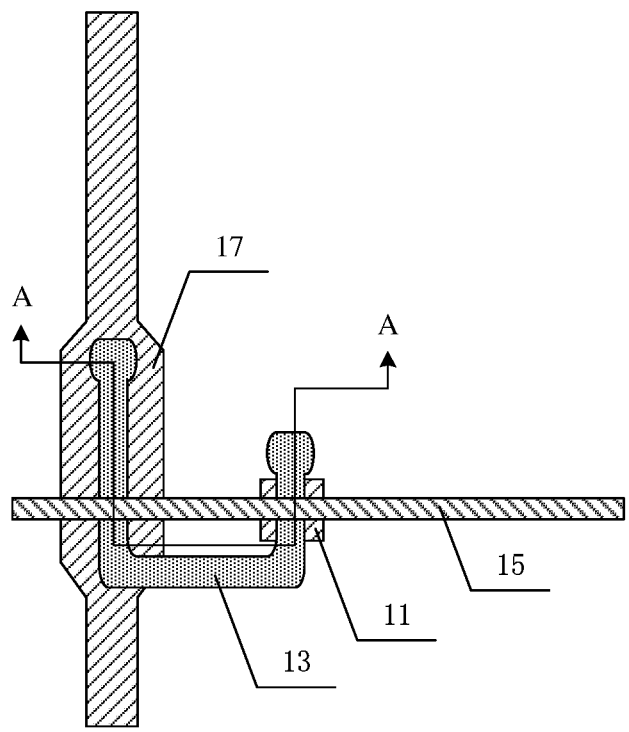
FIG. 9 is a structural schematic diagram of an array substrate after forming patterns of a gate insulation layer and a gate electrode according to an embodiment of the present disclosure.
Figure 10:
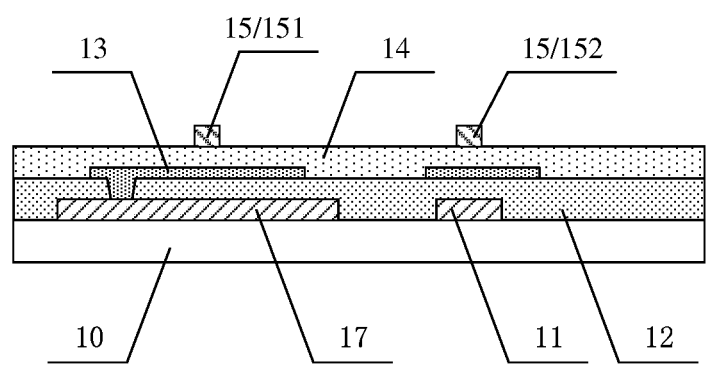
FIG. 10 is a cross-sectional view along a line A-A illustrated in FIG. 9.

(4) A pattern of a gate insulation layer and a pattern of a gate electrode are formed on the base formed with the above patterns. Forming the pattern of the gate insulation layer and the pattern of the pattern of the gate electrode includes: depositing a gate insulation film and a second metal film in sequence on the base formed with the above patterns, patterning the second metal film by a patterning process to form a pattern of a gate insulation layer 14 and a pattern of a gate electrode 15. The gate insulation layer 14 covers the LTPS active layer 13, and the gate electrode 15 is disposed on the gate insulation layer 14, as illustrated in FIG. 9 and FIG. 10. Because the LTPS active layer in this embodiment is in the shape of U, the LTPS active layer and the gate line constitute a double-gate structure, the gate electrode 15 includes a first portion 151 and a second portion 152. The gate insulation film may include silicon nitride SiNx, silicon oxide SiOx or silicon oxynitride Si(ON)x, and may be a single-layer, double-layer or multi-layer structure. The second metal film may include one or more selected from a group consisting of platinum Pt, ruthenium Ru, gold Au, silver Ag, molybdenum Mo, chromium Cr, aluminum Al, tantalum Ta, titanium Ti, tungsten W and other metals, or may adopt a composite layer structure, such as Ti/Al/Ti or Mo/Al/Mo.

Figure 11:
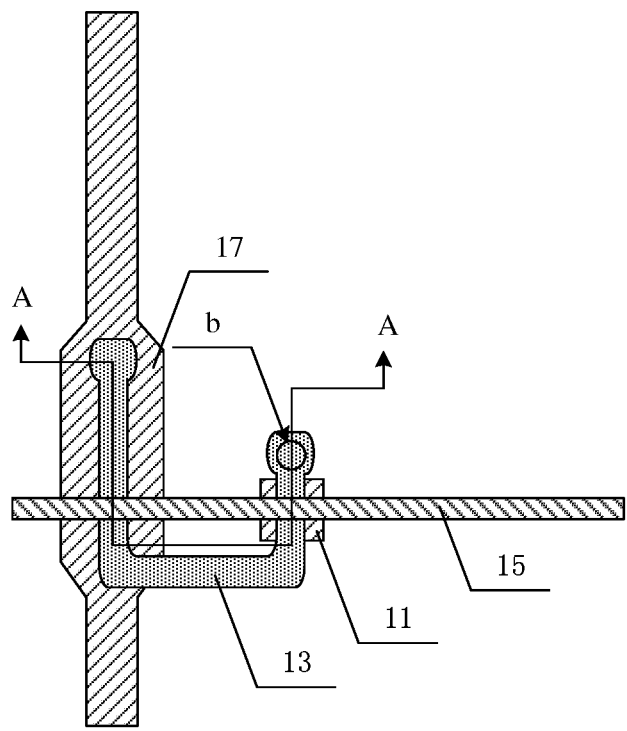
FIG. 11 is a structural schematic diagram of an array substrate after forming a pattern of an interlayer insulation layer having a second via hole according to an embodiment of the present disclosure.
Figure 12:
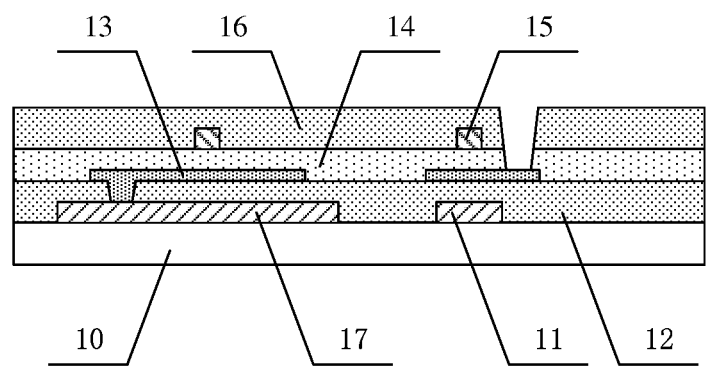
FIG. 12 is a cross-sectional view along a line A-A illustrated in FIG. 11.

(5) A pattern of an interlayer insulation layer with a second via hole is formed on the base formed with the above patterns. Forming the pattern of the interlayer insulation layer with the second via hole includes: depositing an interlayer insulation film on the base formed with the above patterns, and patterning the interlayer insulation film by a patterning process to form a pattern of an interlayer insulation layer 16 with a second via hole b located at the second end of the U-shaped LTPS active layer 13; a portion, which is in the second via hole, of the interlayer insulation layer 16 and a portion, which is in the second via hole, of the gate insulation layer 14 are etched to expose a surface of the LTPS active layer 13, as illustrated in FIG. 11 and FIG. 12. The interlayer insulation film may include silicon nitride SiNx, silicon oxide SiOx or a composite film of SiNx/SiOx.

Figure 13:
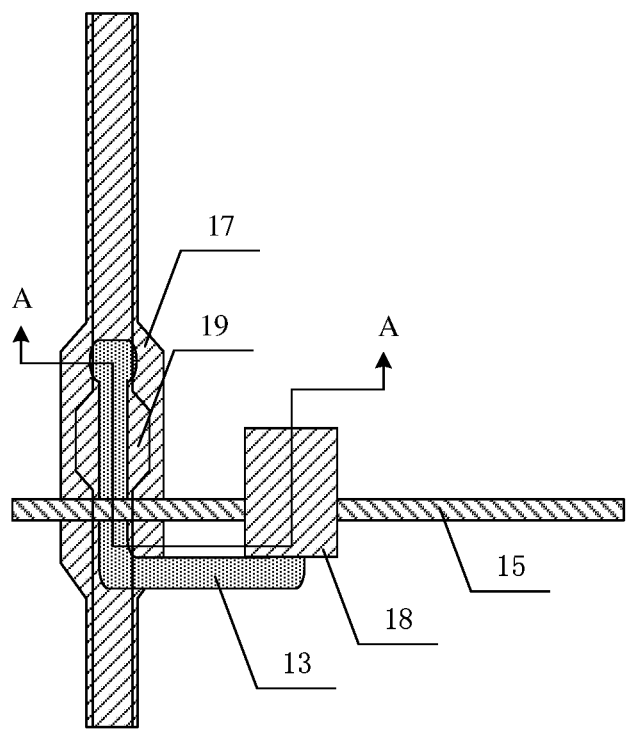
FIG. 13 is a structural schematic diagram of an array substrate after forming patterns of a second electrode and a touch line according to an embodiment of the present disclosure.
Figure 14:
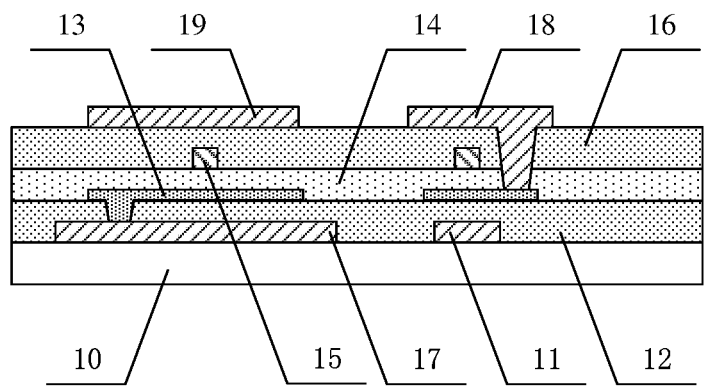
FIG. 14 is a cross-sectional view along a line A-A illustrated in FIG. 13.

(6) A pattern of a second electrode and a pattern of a touch line are formed on the base formed with the above patterns. Forming the pattern of the drain electrode and the pattern of the touch line includes: depositing a third metal film on the base formed with the above patterns, and patterning the third metal film by a patterning process to form a pattern of a second electrode 18 and a pattern of a touch line 19. The second electrode 18 is connected to the second end of the LTPS active layer 13 through the second via hole b in the interlayer insulation layer 16, the touch line 19 is on the first electrode 17, and an orthographic projection of the touch line 19 on the base is within an orthographic projection of the first electrode 17 on the base, as illustrated in FIG. 13 and FIG. 14. The second electrode 18 is a drain electrode. The third metal film may adopt one or more selected from a group consisting of platinum Pt, ruthenium Ru, gold Au, silver Ag, molybdenum Mo, chromium Cr, aluminum Al, tantalum Ta, titanium Ti, tungsten W and other metals, or may adopt a composite layer structure such as Ti/A/Ti or Mo/Al/Mo.

Figure 15:
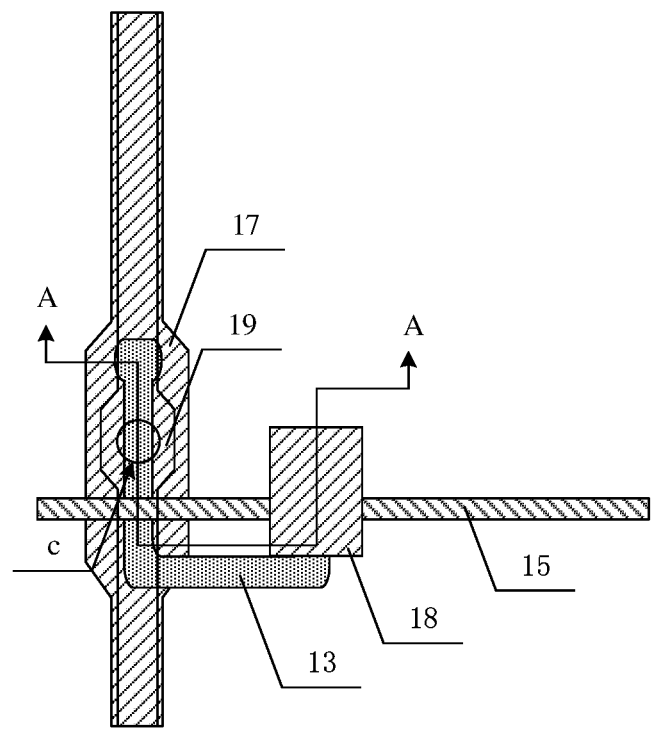
FIG. 15 is a structural schematic diagram of an array substrate after forming a pattern of a flat layer having a third via hole according to an embodiment of the present disclosure.
Figure 16:
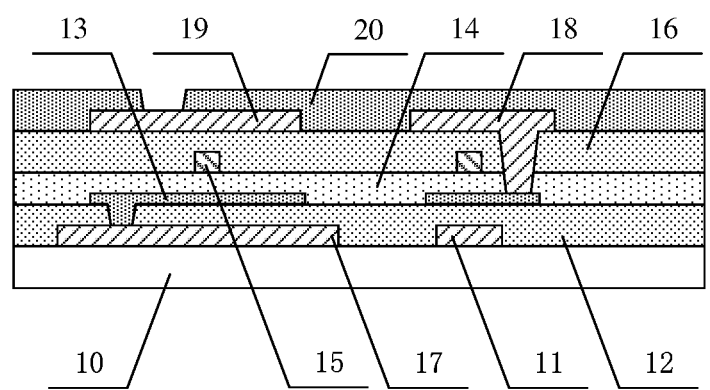
FIG. 16 is a cross-sectional view along a line A-A illustrated in FIG. 15.

(7) A pattern of a flat layer with a third via hole is formed on the base formed with the above patterns. Forming the pattern of the flat layer with the third via hole includes: depositing a flat film on the base formed with the above patterns, and exposing and developing the flat film using a mask to form a flat layer 20 pattern with a third via hole c. The third via hole c is located at a position of the touch line 19, and a portion, which is in the third via hole, of the flat film is removed to expose a surface of the touch line 19, as illustrated in FIG. 15 and FIG. 16. The flat film may include an organic material such as acrylic, etc.

Figure 17:
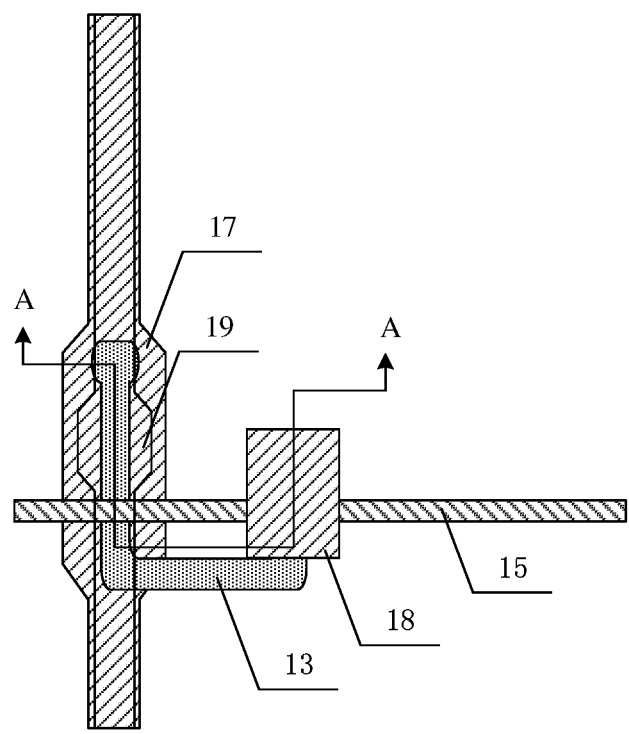
FIG. 17 is a structural schematic diagram of an array substrate after forming a pattern of a touch electrode according to an embodiment of the present disclosure.
Figure 18:
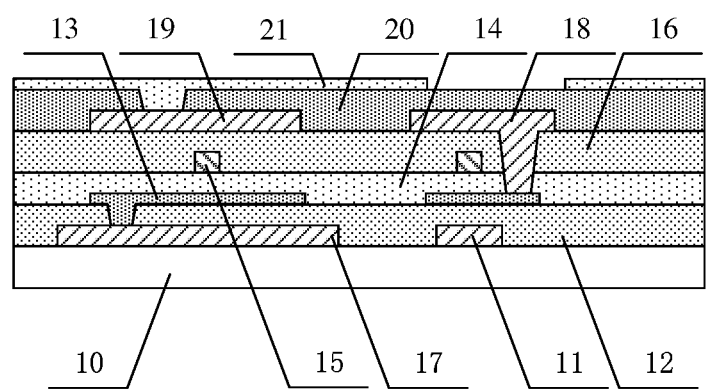
FIG. 18 is a cross-sectional view along a line A-A illustrated in FIG. 17.

(8) A pattern of a touch electrode is formed on the base formed with the above patterns. Forming the pattern of the touch electrode includes: depositing a first transparent film on the base formed with the above patterns, and patterning the first transparent film by a patterning process to form a pattern of a touch electrode 21, and the touch electrode 21 is connected to the touch line 19 through the third via hole c formed in the flat layer 20, as illustrated in FIG. 17 and FIG. 18. The first transparent film may adopt indium tin oxide ITO or indium zinc oxide IZO.

Figure 19:
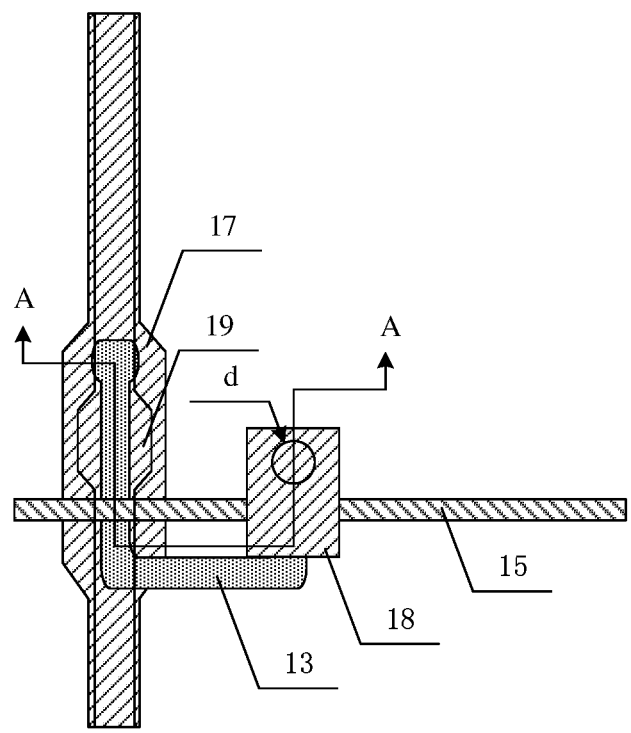
FIG. 19 is a structural schematic diagram of an array substrate after forming a pattern of a passivation layer having a fourth via hole according to an embodiment of the present disclosure.
Figure 20:
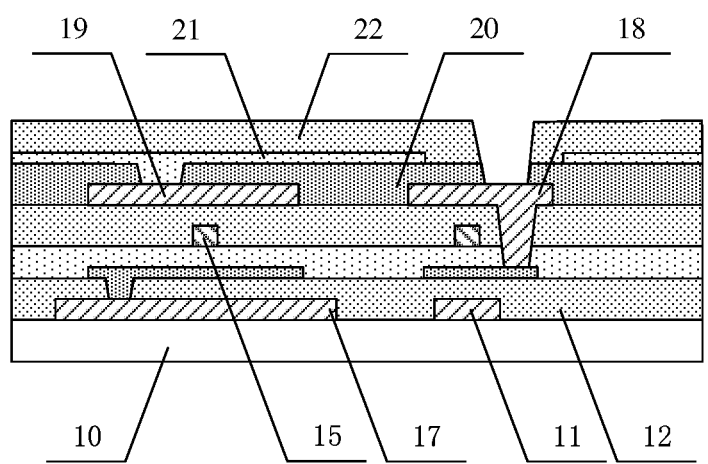
FIG. 20 is a cross-sectional view along a line A-A illustrated in FIG. 19.

(9) A pattern of a passivation layer pattern with a fourth via hole is formed on the base formed with the above patterns. Forming the pattern of the passivation layer with the fourth via hole includes: depositing a passivation film on the base formed with the above patterns, patterning the passivation film by a patterning process to form a pattern of a passivation layer 22 with a fourth via hole d located at a position of the second electrode 18; a portion, which is in the fourth via hole, of the passivation layer 22 and a portion, which is in the fourth via hole, of the flat layer 20 are etched to expose a surface of the second electrode 18, as illustrated in FIG. 19 and FIG. 20. The passivation film may include silicon nitride SiNx, silicon oxide SiOx or a composite film of SiNx/SiOx.

Figure 21:
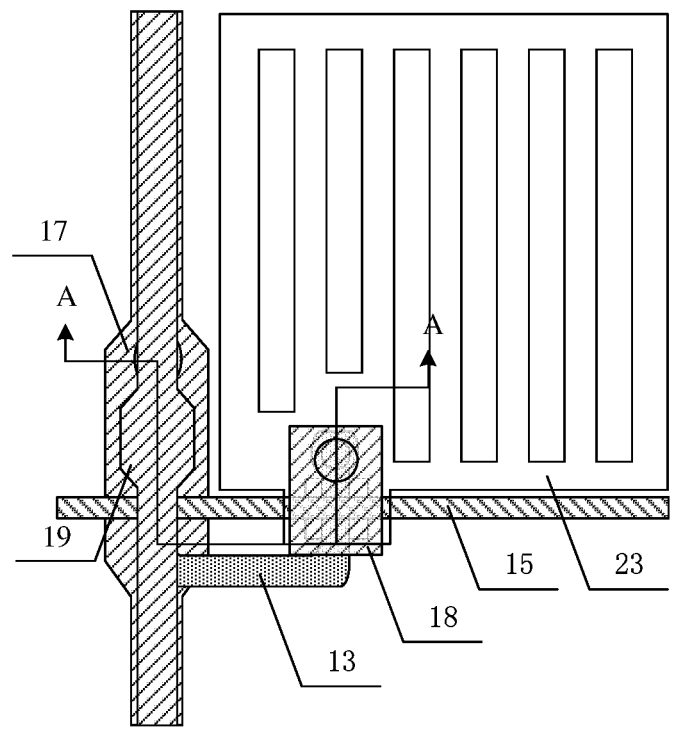
FIG. 21 is a structural schematic diagram of an array substrate after forming a pattern of a pixel electrode according to an embodiment of the present disclosure.
Figure 22:
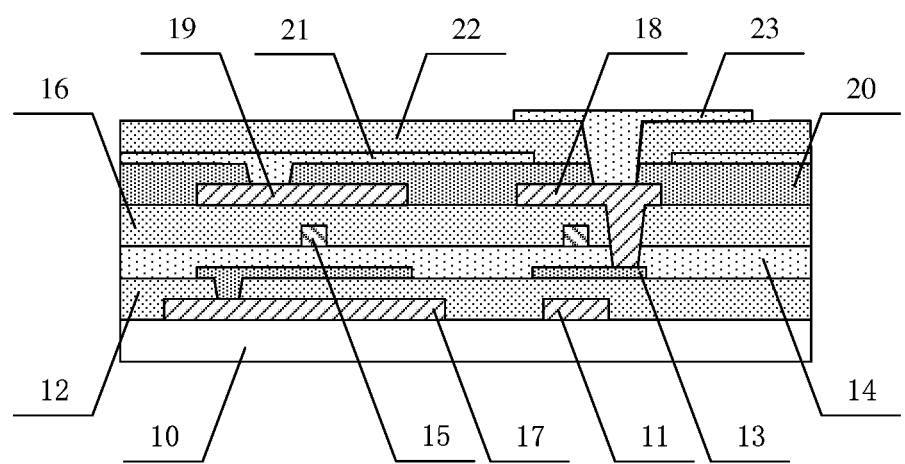
FIG. 22 is a cross-sectional view along a line A-A illustrated in FIG. 21.

(10) A pattern of a pixel electrode is formed on the base formed with the above patterns. Forming the pattern of the pixel electrode includes: depositing a second transparent film on the base formed with the above patterns, patterning the second transparent film by a patterning process to form a pattern of a pixel electrode 23, and the pixel electrode 23 is connected to the second electrode 18 through fourth via hole d formed in the passivation layer 22, as illustrated in FIG. 21 and FIG. 22. The second transparent film may include indium tin oxide ITO or indium zinc oxide IZO.

It can be seen from the process of preparing the array substrate illustrated in FIG. 3 to FIG. 22, compared with the structure in which the source electrode and the touch line are arranged in parallel, in this embodiment, the source electrode and the touch line are arranged in different layers separately, and the orthographic projection of the first electrode on the base at least partially overlaps with the orthographic projection of the touch line on the base, so that the shielding of the touch line in the display region is reduced or cancelled, the opaque wiring region is reduced, the light transmission region is increased, the aperture ratio is maximized, and the brightness is further improved. Meanwhile, the embodiment of the disclosure uses the source electrode as the light shielding structure, which reduces an area of the light shielding layer, not only further increases the light transmission region, but also effectively avoids display defects caused by factors such as alignment precision and the like in a preparation process, and improves the yield.

In this embodiment, the term "the orthographic projection of the first electrode on the base at least partially overlaps with the orthographic projection of the touch line on the base" means that the first electrode is disposed in one structure layer while the touch line is disposed in another structure layer, and the orthographic projection of the touch line on the base coincides with the orthographic projection of the first electrode on the base. The term "the orthographic projection of the touch line on the base is within the orthographic projection of the first electrode on the base" means that a width of the orthographic projection of the touch line on the base is equal to or less than a width of the orthographic projection of the first electrode on the base, and a contour of the orthographic projection of the touch line on the base is surrounded by a contour of the orthographic projection of the first electrode on the base. The term "the orthographic projection of the first electrode on the base is within the orthographic projection of the touch line on the base" means that the width of the orthographic projection of the first electrode on the base is equal to or less than the width of the orthographic projection of the touch line on the base, and the contour of the orthographic projection of the first electrode on the base is surrounded by the contour of the orthographic projection of the touch line on the base. In actual implementation, the width and shape of the touch line and the position of the via hole where the touch line and the touch electrode are connected may be designed according to actual needs, and the touch line may also be configured to transmit the touch signal and a common voltage signal, which is not limited in the present disclosure.

Based on the above-mentioned preparation process of the array substrate, as illustrated in FIG. 21 and FIG. 22, the array substrate of this embodiment includes:

abase 10;

a light shielding layer 11 and a first electrode 17 which are disposed on the base 10;

a buffer layer 12 covering the light shielding layer 11 and the first electrode 17, and provided with a first via hole configured to connect the first electrode 17 with a LTPS active layer 13;

a U-shaped LTPS active layer 13 disposed on the buffer layer 12, in which a first end of the LTPS active layer 13 is connected to the first electrode 17 through the first via hole;

a gate insulation layer 14 covering the LTPS active layer 13;

a gate electrode 15 disposed on the gate insulation layer 14;

an interlayer insulation layer 16 covering the gate electrode 15 and provided with a second via hole configured to connect the second electrode 18 with the LTPS active layer 13, in which the second via hole passes through the interlayer insulation layer 16 and the gate insulation layer 14;

a second electrode 18 and a touch line 19 which are disposed on the interlayer insulation layer 16, in which the second electrode 18 is connected to a second end of the LTPS active layer 13 through the second via hole;

a flat layer 20 which covers the second electrode 18 and the touch line 19, and is provided with a third via hole configured to connect the touch line 19 and the touch electrode 21;

a touch electrode 21 disposed on the flat layer 20 and connected to the touch line 19 through the third via hole;

a passivation layer 22 covering the touch electrode 21 and provided with a fourth via hole configured to connect the second electrode 18 and the pixel electrode 23, in which the fourth via hole passes through the passivation layer 22 and the flat layer 20; and a pixel electrode 23 disposed on the passivation layer 22 and connected to the second electrode 18 through the fourth via hole.

In this embodiment, the first electrode serves as a source electrode, the second electrode serves as a drain electrode, the source electrode and the data line are integrated to form an integrated structure, and the gate electrode and the gate line are integrated to form an integrated structure.

The light shielding layer 11 and the first electrode 17 are disposed on the base 10, which means that the light shielding layer 11 and the first electrode 17 may be disposed directly on the base 10 and in contact with the base 10, or the light shielding layer 11 and the first electrode 17 may be disposed on the base 10 but not in direct contact with the base 10, and other structures are disposed between the light shielding layer 11 as well as the first electrode 17 and the base 10.

Figure 23:
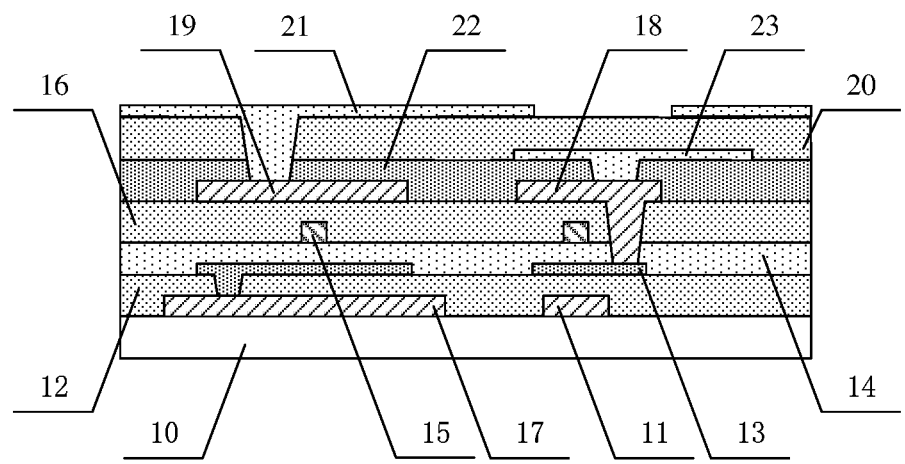
FIG. 23 is a structural schematic diagram of an array substrate according to another embodiment of the present disclosure.

FIG. 23 is a schematic structural diagram of an array substrate according to another embodiment of the present disclosure. This embodiment is a modification of the previous embodiment, in which the touch electrode is disposed above the pixel electrode. As illustrated in FIG. 23, the array substrate of this embodiment includes: a base 10, a light shielding layer 11, a first electrode 17, a buffer layer 12, a u-shaped LTPS active layer 13, a gate insulation layer 14, a gate electrode 15, an interlayer insulation layer 16, a second electrode 18 and a touch line 19. These structure are same as those of the previous embodiment, except that a passivation layer 22 covers the second electrode 18 and the touch line 19, and the passivation layer 22 is provided with a fourth via hole for connecting the second electrode 18 and the pixel electrode 23. The pixel electrode 23 is provided on the passivation layer 22 and is connected with the second electrode 18 through the fourth via hole. The flat layer 20 covers the pixel electrode 23 and is provided with a third via hole for connecting the touch line 19 with the touch electrode 21. The touch electrode 21 is provided on the flat layer 20 and is connected with the touch line 19 through the third via hole.

As in the above-mentioned embodiment, in this embodiment, the first electrode and the touch line are separately arranged in different layers, and the orthographic projection of the touch line on the base is within the orthographic projection of the source electrode on the base, thereby improving the aperture ratio.

Although the above-mentioned embodiment illustrates an LTPS thin film transistor array substrate based on a double-gate structure, the embodiments of the present disclosure may also adopt an array substrate with an LTPS thin film transistor having a single-gate structure based on a same technical concept. For example, the U-shaped LTPS active layer in the previous embodiment may be modified to be L-shaped, a vertical end of the L-shaped active layer is arranged on the source electrode (data line) to form an intersection with the gate electrode (gate line), while a horizontal end of the L-shaped active layer is parallel to the gate line and does not intersect with the gate line, so as to form an array substrate with the LTPS thin film transistor having a single gate structure. The source electrode can play a shielding role, and therefore it is not necessary to provide a light shielding layer.

In addition, an array substrate with other structures may also be used in embodiments of the present disclosure. For example, the LTPS active layer may be replaced with a metal oxide material to form an oxide thin film transistor array substrate. The metal oxide material may be indium gallium zinc oxide (IGZO) or indium tin zinc oxide (ITZO).

Based on the technical solution of the above embodiments, at least one embodiment of the present disclosure further provides a preparation method of an array substrate. The preparation method comprises the following steps.

Forming a first electrode and a second electrode which are configured to transmit a display signal, and a touch line which is configured to transmit a touch signal on the base, in which the first electrode and the touch line are respectively formed in different layers, and an orthographic projection of the first electrode on the base at least partially overlaps with an orthographic projection of the touch line on the base.

For example, the orthographic projection of the touch line on the base is within the orthographic projection of the first electrode on the base, or the orthographic projection of the first electrode on the base is within the orthographic projection of the touch line on the base.

In one embodiment, the second electrode and the touch line are disposed in the same layer and formed by a single patterning process. In another embodiment, the second electrode and the first electrode are disposed in the same layer and formed by a single patterning process.

In one embodiment, the preparation method of the array substrate comprises:

S11: forming the first electrode on the base;

S12: forming a buffer layer that covers the first electrode and has a first via hole, in which the first via hole is configured to connect the first electrode and an LTPS active layer;

S13: forming the LTPS active layer on the buffer layer, in which the LTPS active layer is connected with the first electrode through the first via hole;

S14: forming a gate insulation layer that covers the LTPS active layer, and forming a gate electrode on the gate insulation layer;

S15: forming an interlayer insulation layer that covers the gate electrode and has a second via hole, in which the second via hole is configured to connect the LTPS active layer and the second electrode;

S16: forming the second electrode and the touch line on the interlayer insulation layer, in which the second electrode is connected with the LTPS active layer through the second via hole.

S17: forming a flat layer that covers the second electrode and the touch line and has a third via hole, in which the third via hole is configured to connect the touch line and the touch electrode;

S18: forming a touch electrode on the flat layer, in which the touch electrode is connected with the touch line through the third via hole, S19: forming a passivation layer that covers the touch electrode and forming a fourth via hole passing through the passivation layer and the flat layer;

S110: forming a pixel electrode on the passivation layer, in which the pixel electrode is connected with the second electrode through the fourth via hole.

In the method mentioned above, a light shielding layer is formed on the base when the first electrode is formed.

In another embodiment, the preparation method of the array substrate comprises:

S21~S26: same as S11~S16;

S27: forming a passivation layer that covers the second electrode and the touch line and has a fourth via hole, in which the fourth via hole is configured to connect the second electrode and a pixel electrode;

S28: forming the pixel electrode on the passivation layer, in which the pixel electrode is connected with the second electrode through the fourth via hole, S29: forming a flat layer that covers the pixel electrode, and forming a third via hole passing through the flat layer and the passivation layer;

S210: forming a touch electrode on the flat layer, in which the touch electrode is connected with the touch line through the third via hole.

In this embodiment, the first electrode serves as a source electrode, the second electrode serves as a drain electrode, and the source electrode and the data line are integrated to an integrated structure.

Based on the inventive concept of the present disclosure, at least one embodiment of the present disclosure further provides a touch display panel, the touch display panel comprises the array substrate provided by the previous embodiments. The touch display panel may be any product or component with display function such as a mobile phone, a tablet computer, a television, a display, a notebook computer, a digital photo frame, a navigator and the like.

What have been described above are only specific implementations of the present disclosure, the protection scope of the present disclosure is not limited thereto. The protection scope of the present disclosure should be based on the protection scope of the claims.

What is claimed is:

1. An array substrate, comprising:
   a base,
   a first electrode and a second electrode which are on the base, and
   a touch line on the base, wherein both the first electrode and the second electrode are configured to transmit a display signal, the touch line is configured to transmit a touch signal, and wherein the first electrode and the touch line are respectively in different layers, and an orthographic projection of the first electrode on the base at least partially overlaps with an orthographic projection of the touch line on the base;
   wherein the array substrate further comprises a buffer layer, an active layer and a light shielding layer, in a direction perpendicular to the base, the active layer is between the first electrode and the second electrode, the buffer layer is between the active layer and the first electrode, and the light shielding layer and the first electrode are on a same side of the active layer;
   the active layer is in a shape of U, a first end of the active layer is on the first electrode and is connected to the first electrode through a first via hole in the buffer layer, and a second end of the active layer is on and crosses over the light shielding layer;
   the array substrate further comprises a thin film transistor, the thin film transistor comprises the first electrode, the second electrode and the active layer, the thin film transistor further comprises a gate electrode, the gate electrode comprises a first portion and a second portion, an orthographic projection of the first portion on the base at least partially overlaps with an orthographic projection of the active layer on the base, an orthographic projection of the second portion on the base at least partially overlaps with the orthographic projection of the active layer on the base; and
   the orthographic projection of the first portion on the base is within the orthographic projection of the first electrode on the base, and the orthographic projection of the second portion on the base is within the orthographic projection of the light shielding layer on the base.

2. The array substrate according to claim 1, wherein the orthographic projection of the touch line on the base is within the orthographic projection of the first electrode on the base.

3. The array substrate according to claim 1, wherein the second electrode and the touch line are in a same layer.

4. The array substrate according to claim 1, wherein the touch line is further configured to transmit a common voltage signal.

5. The array substrate according to claim 1, further comprising a gate insulation layer and an interlayer insulation layer,
   wherein the buffer layer covers the first electrode, the gate insulation layer covers the active layer, the gate electrode is on a side of the gate insulation layer that is away from the active layer, the interlayer insulation layer covers the gate electrode, the second electrode and the touch line are on a side of the interlayer insulation layer that is away from the gate electrode, and the second electrode is connected with the active layer through a via hole in the interlayer insulation layer.

6. The array substrate according to claim 1, wherein the light shielding layer and the first electrode are in a same layer.

7. The array substrate according to claim 1, further comprising a flat layer, a touch electrode, a passivation layer and a pixel electrode,
   wherein the flat layer covers the second electrode and the touch line, the touch electrode is on a side of the flat layer that is away from the second electrode and is connected with the touch line through a via hole in the flat layer, the passivation layer covers the touch electrode, and the pixel electrode is on a side of the passivation layer that is away from the touch electrode and is connected with the second electrode through a via hole passing through the passivation layer and the flat layer.

8. A touch display panel, comprising the array substrate according to claim 1.

9. The array substrate according to claim 1, wherein the orthographic projection of the first electrode on the base is within the orthographic projection of the touch line on the base.

10. The array substrate according to claim 1, further comprising a flat layer, a touch electrode, a passivation layer and a pixel electrode,
    wherein the passivation layer covers the second electrode and the touch line, the pixel electrode is on a side of the passivation layer that is away from the second electrode and is connected with the second electrode through a via hole in the passivation layer, the flat layer covers the pixel electrode, and the touch electrode is on a side of the flat layer that is away from the pixel electrode and is connected with the touch line through a via hole passing through the flat layer and the passivation layer.

11. A preparation method of an array substrate, comprising:
   forming a first electrode and a second electrode which are configured to transmit a display signal and a touch line which is configured to transmit a touch signal on a base, wherein the first electrode and the touch line are respectively formed in different layers, and an orthographic projection of the first electrode on the base at least partially overlaps with an orthographic projection of the touch line on the base;
   wherein the preparation method further comprises: forming a buffer layer, an active layer and a light shielding layer,
   in a direction perpendicular to the base, the active layer is between the first electrode and the second electrode, the buffer layer is between the active layer and the first electrode, and the light shielding layer and the first electrode are on a same side of the active layer;
   the active layer is in a shape of U, a first end of the active layer is on the first electrode and is connected to the first electrode through a first via hole in the buffer layer, and a second end of the active layer is on and crosses over the light shielding layer;
   wherein the array substrate comprises a thin film transistor, the thin film transistor comprises the first electrode, the second electrode and the active layer, the thin film transistor further comprises a gate electrode, the gate electrode comprises a first portion and a second portion, an orthographic projection of the first portion on the base at least partially overlaps with an orthographic projection of the active layer on the base, an orthographic projection of the second portion on the base at least partially overlaps with the orthographic projection of the active layer on the base, and
   wherein the orthographic projection of the first portion on the base is in the orthographic projection of the first electrode on the base, and the orthographic projection of the second portion on the base is in the orthographic projection of the light shielding layer on the base.

12. The preparation method of the array substrate according to claim 11, wherein the orthographic projection of the touch line on the base is within the orthographic projection of the first electrode on the base.

13. The preparation method of the array substrate according to claim 11, wherein the second electrode and the touch line are in a same layer.

14. The preparation method of the array substrate according to claim 11, wherein the touch line is further configured to transmit a common voltage signal.

15. The preparation method of the array substrate according to claim 11, wherein forming the first electrode and the second electrode which are configured to transmit a display signal and the touch line which is configured to transmit a touch signal on the base comprises:
   forming the first electrode on the base;
   forming the buffer layer that covers the first electrode and has a first via hole;
   forming the active layer on a side of the buffer layer that is away from the first electrode, wherein the active layer is connected with the first electrode through the first via hole;
   forming a gate insulation layer that covers the active layer, and forming the gate electrode on a side of the gate insulation layer that is away from the active layer,
   forming an interlayer insulation layer that covers the gate electrode and has a second via hole; and
   forming the second electrode and the touch line on a side of the interlayer insulation layer that is away from the gate electrode, wherein the second electrode is connected with the active layer through the second via hole.

16. The preparation method of the array substrate according to claim 15, wherein a light shielding layer is formed when the first electrode is formed on the base.

17. The preparation method of the array substrate according to claim 15, wherein forming the active layer on the side of the buffer layer that is away from the first electrode comprises: forming a low temperature polysilicon active layer on the side of the buffer layer that is away from the first electrode.

18. The preparation method of the array substrate according to claim 11, further comprising:
   forming a flat layer that covers the second electrode and the touch line and has a third via hole,
   forming a touch electrode on a side of the flat layer that is away from the second electrode, wherein the touch electrode is connected with the touch line through the third via hole,
   forming a passivation layer that covers the touch electrode, and forming a fourth via hole passing through the passivation layer and the flat layer, and
   forming a pixel electrode on a side of the passivation layer that is away from the touch electrode, wherein the pixel electrode is connected with the second electrode through the fourth via hole.

19. The preparation method of the array substrate according to claim 11, wherein the orthographic projection of the first electrode on the base is within the orthographic projection of the touch line on the base.

20. The preparation method of the array substrate according to claim 11, further comprising:
   forming a passivation layer that covers the second electrode and the touch line and has a fourth via hole,
   forming a pixel electrode on a side of the passivation layer that is away from the second electrode, wherein the pixel electrode is connected with the second electrode through the fourth via hole,
   forming a flat layer that covers the pixel electrode, and forming a third via hole passing through the flat layer and the passivation layer, and
   forming a touch electrode on a side of the flat layer that is away from the pixel electrode, wherein the touch electrode is connected with the touch line through the third via hole.

* * * * *